US012637616B2

(12) United States Patent
Liu et al.

(10) Patent No.: US 12,637,616 B2
(45) Date of Patent: May 26, 2026

(54) ETCHING SOLUTION FOR SELECTIVELY REMOVING SILICON-GERMANIUM ALLOY FROM A SILICON-GERMANIUM/ SILICON STACK DURING MANUFACTURE OF A SEMICONDUCTOR DEVICE

(71) Applicant: Versum Materials US, LLC, Tempe, AZ (US)

(72) Inventors: Wen Dar Liu, Chupei City (TW); Yi-Chia Lee, Chupei City (TW); Aiping Wu, Chandler, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 249 days.

(21) Appl. No.: 18/561,030

(22) PCT Filed: Apr. 26, 2022

(86) PCT No.: PCT/US2022/071907

§ 371 (c)(1),
(2) Date: Nov. 15, 2023

(87) PCT Pub. No.: WO2022/246356

PCT Pub. Date: Nov. 24, 2022

(65) Prior Publication Data

US 2024/0271040 A1 Aug. 15, 2024

Related U.S. Application Data

(60) Provisional application No. 63/191,530, filed on May 21, 2021.

(51) Int. Cl.
*C09K 13/08* (2006.01)
*H10P 50/64* (2026.01)

(52) U.S. Cl.
CPC ............ *C09K 13/08* (2013.01); *H10P 50/642* (2026.01)

(58) Field of Classification Search
CPC ........ C09K 13/08; C09K 13/00; C09K 13/06; H01L 21/30604; C23F 1/30
USPC ................................................ 252/79.1–79.3
See application file for complete search history.

(56) References Cited

U.S. PATENT DOCUMENTS

| | | | | |
|---|---|---|---|---|
| 2010/0041234 | A1 | 2/2010 | Weigel et al. | |
| 2015/0247087 | A1* | 9/2015 | Kamimura | C09K 13/10 252/79.3 |
| 2018/0142151 | A1 | 5/2018 | Lee et al. | |
| 2018/0163130 | A1 | 6/2018 | Kim et al. | |
| 2019/0088492 | A1 | 3/2019 | Liu et al. | |
| 2019/0284704 | A1* | 9/2019 | Ge | H01L 21/32134 |
| 2019/0359887 | A1 | 11/2019 | Kim et al. | |
| 2020/0148949 | A1 | 5/2020 | Xu et al. | |
| 2020/0157423 | A1 | 5/2020 | Bilodeau et al. | |
| 2021/0104411 | A1 | 4/2021 | Chung et al. | |

FOREIGN PATENT DOCUMENTS

| | | | |
|---|---|---|---|
| EP | 347791 | A1 | 2/2019 |
| KR | 10-2016-0010302 | A | 1/2016 |
| KR | 10-2018-0109429 | A | 10/2018 |
| TW | I683038 | B | 1/2020 |
| TW | 202037761 | A | 10/2020 |
| TW | I710666 | B * | 11/2020 |
| TW | I714013 | B | 12/2020 |
| WO | 2008121952 | A1 | 10/2008 |
| WO | 2017007893 | A1 | 1/2017 |
| WO | 2018/168874 | A1 | 9/2018 |
| WO | 2020/185762 | A1 | 9/2020 |
| WO | 2021/004759 | A1 | 1/2021 |
| WO | 2021/067150 | A1 | 4/2021 |

OTHER PUBLICATIONS

Patent Cooperation Treaty PCT International Search Report; International Application No. PCT/US2022/071907; Aug. 30, 2022.
“Extended European Search Report received for European Patent Application No. 22805682.6, mailing date Jan. 29, 2025”, 10 Pages.
“International Preliminary Report on Patentability received for PCT Application No. PCT/US2022/071907, mailing date Nov. 30, 2023”, 07 Pages.

* cited by examiner

*Primary Examiner* — Duy Vu N Deo
(74) *Attorney, Agent, or Firm* — Versum Materials US, LLC; William T. Slaven, IV

(57) ABSTRACT

The disclosed and claimed subject matter pertains to an etching solution including (i) water, (ii) at least one oxidizer, (iii) at least one fluoride ion source, (iv) at least one polyfunctional acid; (v) at least one corrosion inhibiting surfactant, (vi) at least one silane silicon oxide etch inhibitor and (vii) optionally at least one water-miscible organic solvent. The solutions are useful for the selective removal of silicon-germanium over poly silicon from a microelectronic device having such material(s) thereon during its manufacture.

20 Claims, No Drawings

ETCHING SOLUTION FOR SELECTIVELY REMOVING SILICON-GERMANIUM ALLOY FROM A SILICON-GERMANIUM/ SILICON STACK DURING MANUFACTURE OF A SEMICONDUCTOR DEVICE

CROSS-REFERENCE TO RELATED APPLICATIONS

This application is a national stage application, filed under 35 U.S.C. § 371, of International Patent Application No. PCT/US2022/071907 (filed on 26 Apr. 2022) which claims the benefit of U.S. Provisional Patent Application No. 63/191,530 (filed on 21 May 2021) each of which applications is incorporated herein by reference in their entirety.

BACKGROUND

Field

The disclosed and claimed subject matter relates to aqueous etching solutions used in the manufacture of semiconductor devices. More specifically, the disclosed and claimed subject matter provides an aqueous etching solution that exhibits high etch selectivity of silicon-germanium alloy films over silicon films with high compatibility to $SiO_2$ in silicon-germanium/silicon composite semiconductor devices.

Related Art

With constant down-scaling and increasingly demanding requirements to the speed and functionality of ultra-high density integrated circuits, conventional planar metal-oxide-semiconductor field effect transistors (MOSFETs) face increasing challenges with such issues as scaling of gate oxide thickness and electrostatic control of the gate electrode over the channel region. Fin field effect transistors (FinFETs) have exhibited improved control over a planar gate MOSFET design by wrapping the gate electrode over three sides of a fin-shaped channel.

GAA MOSFETs are similar to FinFETs but have the potential of even greater electrostatic control over the channel because the gate electrode completely surrounds the channel. In a GAA MOSFET, the channel region is essentially a nanowire. The nanowire channel typically has a thickness (or diameter) in the tens of nanometers (nm) or less and has an unconstrained length. The nanowire channel is suspended generally horizontally between, and anchored to, the much larger source and drain regions of the GAA MOSFET.

GAA MOSFETs can be fabricated on a bulk silicon substrate utilizing fully compatible CMOS technology. A typical manufacturing method of forming the channel regions in a GAA MOSFET involves epitaxially growing a stack (epi-stack) of sacrificial layers sandwiched between channel layers on top of a bulk substrate. The sacrificial layers and channel layers are composed of two different materials so that selective etching can remove the sacrificial layers.

By way of example, an epi-stack can be formed of alternating silicon (Si) and silicon germanium (SiGe) layers, wherein the SiGe layers are the sacrificial layers and the Si layers are the channel layers. The SiGe layers can then be removed by selective etching (for example via a wet etching process such as a hydrogen peroxide containing solution), which also inadvertently recesses trenches into the bulk substrate due to the similarity of materials composing the sacrificial layers and the substrate. Once the SiGe layers are removed, the Si layers can subsequently be formed into the nanowire channels suspended over the trenches. A thin gate dielectric is then disposed around the Si nanowire channels and over the recessed trenches of the substrate. Metal is then disposed over the dielectric to form the metal gate electrode of the GAA MOSFET.

Conventional wet chemical etching solutions for etching SiGe alloys typically employ an oxidizer and an oxide removal agent. The most common solutions are HF for silicon oxide etching and a solution of hydrogen peroxide ($H_2O_2$) and acetic acid ($CH_3COOH$) for SiGe oxidation. A $H_2O_2/CH_3COOH$ mixture is highly selective towards Sil-xGex over Si with improved smoothness; however, this chemistry is not as effective at removing silicon-germanium on vertical stacks and is not compatible with nitride/oxide masks.

Applicant's prior-filed application (U.S. Patent Application Publication No. 2019/0088492) generally discloses etching solutions that include water, an oxidizer, a water miscible organic solvent, a fluoride ion source and optionally a surfactant. However, these formulations were not particularly compatible with $SiO_2$ which is generally a layer present in the silicon and SiGe stack. These formulations had relatively high $SiO_2$ etch rates which resulted in lower selectivity of SiGe over $SiO_2$. Therefore, there is a need to develop a formulation that has high selectivity of SiGe over $SiO_2$ along with high selectivity of SiGe over Si which is addressed by the presently disclosed and claimed subject matter.

Accordingly, there is a need in the art for a silicon-germanium etchant solution and method for using the same in forming, for example, Si nanowire channels in GAA MOSFETS, which provides better control of the etching process during removal of sacrificial SiGe layers that does not suffer from the above-mentioned drawbacks.

SUMMARY

This summary section does not specify every embodiment and/or incrementally novel aspect of the disclosed and claimed subject matter. Instead, this summary only provides a preliminary discussion of different embodiments and corresponding points of novelty over conventional techniques and the known art. For additional details and/or possible perspectives of the disclosed and claimed subject matter and embodiments, the reader is directed to the Detailed Description section and corresponding figures of the disclosure as further discussed below.

In one aspect, the disclosed and claimed subject matter pertains to an etching solution suitable for the selective removal of silicon-germanium over silicon with good compatibility to $SiO_2$ from a microelectronic device that includes:

(i) water;
(ii) at least one oxidizer;
(iii) at least one fluoride ion source;
(iv) at least one polyfunctional acid;
(v) at least one corrosion inhibiting surfactant;
(vi) at least one silane silicon oxide etch inhibitor; and
(vii) optionally at least one water-miscible organic solvent.

In another aspect, the disclosed and claimed subject matter provides a method of selectively enhancing the etch rate of silicon-germanium relative to silicon with compatibility to $SiO_2$ layer on a microelectronic device including silicon and silicon-germanium, the method including, consisting essentially of or consisting of the steps of:

(a) contacting a microelectronic (composite semiconductor) device including silicon and silicon-germanium with an etching solution described herein;

(b) rinsing the microelectronic (composite semiconductor) device after the silicon-germanium is at least partially removed; and (c) optionally drying the microelectronic.

Other features and advantages of the disclosed and claimed subject matter will be apparent from the following more detailed description, taken in conjunction with the example solutions which illustrate the principles of the disclosed and claimed subject matter.

The order of discussion of the different steps described herein has been presented for clarity sake. In general, the steps disclosed herein can be performed in any suitable order. Additionally, although each of the different features, techniques, configurations, etc. disclosed herein may be discussed in different places of this dis/closure, it is intended that each of the concepts can be executed independently of each other or in combination with each other as appropriate. Accordingly, the disclosed and claimed subject matter can be embodied and viewed in many different ways.

Definitions

For the purposes of promoting an understanding of what is claimed, references will now be made to the embodiments illustrated and specific language will be used to describe the same. It will nevertheless be understood that no limitation of the scope of what is claimed is thereby intended, such alterations and further modifications and such further applications of the principles thereof as illustrated therein being contemplated as would normally occur to one skilled in the art to which the disclosure relates.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the disclosed and claimed subject matter (especially in the context of the following claims) are to be construed to cover both the singular and the plural, unless otherwise indicated herein or clearly contradicted by context. The terms "comprising." "having." "including." and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosed and claimed subject matter and does not pose a limitation on the scope thereof unless otherwise claimed. No language in the specification should be construed as indicating any non-claimed element as essential to the practice of the disclosed and claimed subject matter.

Preferred embodiments of disclosed and claimed subject matter are described herein, including the best mode known to the inventors for carrying out the disclosed and claimed subject matter. Variations of those preferred embodiments may become apparent to those of ordinary skill in the art upon reading the foregoing description. The inventors expect skilled artisans to employ such variations as appropriate, and the inventors intend for the disclosed and claimed subject matter to be practiced otherwise than as specifically described herein. Accordingly, this disclosed and claimed subject matter includes all modifications and equivalents of the subject matter recited in the claims appended hereto as permitted by applicable law. Moreover, any combination of the above-described elements in all possible variations thereof is encompassed by the disclosed and claimed subject matter unless otherwise indicated herein or otherwise clearly contradicted by context.

For case of reference, "microelectronic device" or "semiconductor substrates" correspond to semiconductor wafers, flat panel displays, phase change memory devices, solar panels and other products including solar substrates, photovoltaics, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly. The microelectronic device or semiconductor substrates includes low-k dielectric material, barrier materials, and metals, such as, Al, Cu, SnAg alloy. W. Ti, TiN, one or more passivation layers, such as polyimide or polybenzoxazole, as well as Si and other materials thereon.

A "composite semiconductor device" or "composite microelectronic device" means that the device has more than one materials and/or layers and/or portions of layers present on a non-conductive substrate. The materials includes high K dielectrics, and/or low K dielectrics and/or barrier materials and/or capping materials and/or metal layers and/or others known to persons of skill.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "high-K dielectric material" refers to a material with a high dielectric constant K (as compared to silicon dioxide). High-K dielectrics may be used to replace a silicon dioxide gate dielectric or another dielectric layer of a microelectronic device. The high-k material may be hafnium dioxide ($HfO_2$), hafnium oxynitride (HfON), zirconium dioxide ($ZrO_2$), zirconium oxynitride (ZrON), aluminum oxide ($Al_2O_3$), aluminum oxynitride (AlON), hafnium silicon oxide ($HfSiO_2$), hafnium aluminum oxide (HfAlO), zirconium silicon oxide ($ZrSiO_2$), tantalum dioxide ($Ta_2O_5$), aluminum oxide, $Y_2O_3$, $La_2O_3$, titanium oxide ($TiO_2$), aluminum doped hafnium dioxide, bismuth strontium titanium (BST), or platinum zirconium titanium (PZT).

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, titanium tungsten, ruthenium, hafnium, and other refractory metals and their nitrides and silicides.

"Substantially free" is defined herein as less than approximately 1 wt. %, more preferably less than approximately 0.5 wt. %, and most preferably less than approximately 0.2 wt. %. "Substantially free" also includes approximately 0.0 wt. %. The term "free of" means 0.0 wt. %.

The term "about" or "approximately." when used in connection with a measurable numerical variable, refers to the indicated value of the variable and to all values of the variable that are within the experimental error of the indicated value (e.g., within the 95% confidence limit for the mean) or within percentage of the indicated value (e.g., ±10%, ±5%), whichever is greater.

In all such solutions, wherein specific components of the solution are discussed in reference to weight percentage ranges including a zero lower limit, it will be understood that such components may be present or absent in various specific embodiments of the solution, and that in instances where such components are present, they may be present at concentrations as low as 0.001 weight percent, based on the total weight of the solution in which such components are employed. Note all defined weight percent of the components unless otherwise indicated are based on the total weight of the solution. Further, all weight percent unless otherwise indicated are "neat" meaning that they do not include the aqueous solution in which they are present when added to the solution. Any reference to "at least one" could be substituted with "one or more." "At least one" and/or "one or more" includes "at least two" or "two or more" and "at least three" and "three or more" and so on.

The disclosed and claimed etching solutions include (i) water;
(ii) at least one oxidizer;
(iii) at least one fluoride ion source;
(iv) at least one polyfunctional acid;
(v) at least one corrosion inhibiting surfactant;
(vi) at least one silane silicon oxide etch inhibitor; and
(vii) optionally at least one water-miscible organic solvent.

In a further aspect of this embodiment, the etching solution includes the at least one water-miscible organic solvent.

In a further embodiment, the etching solution consists essentially of (i) water, (ii) at least one oxidizer, (iii) at least one fluoride ion source, (iv) at least one polyfunctional acid, (v) at least one corrosion inhibiting surfactant, (vi) at least one silane silicon oxide etch inhibitor and (vii) optionally at least one water-miscible organic solvent. In such an embodiment, the combined amounts of (i), (ii), (iii), (iv), (v), (vi) and (vii) (if present) do not equal 100% by weight, and can include other ingredients (e.g., additional solvent(s), including water, common additives and/or impurities) that do not materially change the effectiveness of the cleaning solution. In a further aspect of this embodiment, the etching solution includes the at least one water-miscible organic solvent.

In a further embodiment, the etching solution consists of (i) water, (ii) at least one oxidizer, (iii) at least one fluoride ion source, (iv) at least one polyfunctional acid, (v) at least one corrosion inhibiting surfactant, (vi) at least one silane silicon oxide etch inhibitor and (vii) optionally at least one water-miscible organic solvent. In such an embodiment, the combined amounts of (i), (ii), (iii), (iv), (v), (vi) and (vii) (if present) equal approximately 100% by weight but includes other small and/or trace amounts of impurities that are present in such small quantities that they do not materially change the effectiveness of the solution. For example, in one such embodiment, the etching solution can contain 2% by weight or less of impurities. In another embodiment, the etching solution can contain 1% by weight or less than of impurities. In a further embodiment, the etching solution can contain 0.05% by weight or less than of impurities. In a further aspect of this embodiment, the etching solution includes the at least one water-miscible organic solvent.

When referring to etching solutions described herein in terms of weight %, it is understood that in no event shall the weight % of all components, including non-essential components, such as impurities, add to more than 100 weight %. In solutions "consisting essentially of" recited components, such components may add up to 100 weight % of the solution or may add up to less than 100 weight %. Where the components add up to less than 100 weight %, such solution includes some small amounts of a non-essential contaminants or impurities. For example, in one such embodiment, the solution can contain 2% by weight or less of impurities. In another embodiment, the rinse can contain 1% by weight or less than of impurities. In a further embodiment, the solution can contain 0.05% by weight or less than of impurities. In other such embodiments, the ingredients can form at least 90 wt %, more preferably at least 95 wt %, more preferably at least 99 wt %, more preferably at least 99.5 wt %, most preferably at least 99.8 wt %, and can include other ingredients that do not affect the performance of the wet etchant. Otherwise, if no significant non-essential impurity component is present, it is understood that the solution of all essential constituent components will essentially add up to 100 wt %.

DETAILED DESCRIPTION

It is to be understood that both the foregoing general description and the following detailed description are illustrative and explanatory, and are not restrictive of the subject matter, as claimed. The objects, features, advantages and ideas of the disclosed subject matter will be apparent to those skilled in the art from the description provided in the specification, and the disclosed subject matter will be readily practicable by those skilled in the art on the basis of the description appearing herein. The description of any "preferred embodiments" and/or the examples which show preferred modes for practicing the disclosed subject matter are included for the purpose of explanation and are not intended to limit the scope of the claims.

It will also be apparent to those skilled in the art that various modifications may be made in how the disclosed subject matter is practiced based on described aspects in the specification without departing from the spirit and scope of the disclosed subject matter disclosed herein.

As set forth above, the disclosed and claimed subject matter relates to an etching solution suitable for the selective removal of silicon-germanium over silicon with good compatibility to $SiO_2$ from a microelectronic device that includes:

(i) water;
(ii) at least one oxidizer;
(iii) at least one fluoride ion source;
(iv) at least one polyfunctional acid;
(v) at least one corrosion inhibiting surfactant;
(vi) at least one silane silicon oxide etch inhibitor; and
(vii) optionally at least one water-miscible organic solvent.

In some embodiments, the etching solution solutions disclosed herein are formulated to be substantially free or free of inorganic bases and/or quaternary ammonium compounds, that includes quaternary ammonium fluorides and/ or quaternary ammonium hydroxides, for examples the solution may be free of one or more of the following: tetramethylammonium fluoride, tetraethylammonium fluoride, methyltriethylammonium fluoride, and tetrabutylammonium fluoride, tetramethylammonium hydroxide, tetraethylammonium hydroxide, methyltriethylammonium hydroxide, and/or tetrabutylammonium hydroxide.

(i) Water

As noted above, the etching solutions of the disclosed and claimed subject matter include water. In the disclosed and claimed subject matter, water functions in various ways, such as, for example, to dissolve one or more components of the solution, as a carrier of the components, as an aid in the removal of residue, as a viscosity modifier of the solution and as a diluent. Preferably, the water employed in the cleaning solution is de-ionized (DI) water. The ranges of water described in the next paragraph include all of the water in the solution from any source.

For most applications, the weight percent of water in the solution will be present in a range with start and end points selected from the following group of numbers: 0.5, 1, 5, 10, 15, 20, 25, 30, 40, 45, 50, 55, 60, 65, 70, 75, 80, 85 and 90. Examples of the ranges of water that may be used in the solution include, for examples, from about 0.5% to about 90% by wt., or 1% to about 85% by wt. of water; or from about 5.0% to about 80% by wt., or from about 10% to about 70% by wt., or from about 40% to about 80% by wt. of water. Still other preferred embodiments of the disclosed and claimed subject matter includes water in an amount to achieve the desired weight percent of the other ingredients.

In one embodiment, the solutions include about 40 wt % to about 90 wt % of water. In one embodiment, the solutions include about 40 wt % to about 90 wt % of water. In one embodiment, the solutions include about 50 wt % to about 80 wt % of water. In one embodiment, the solutions include about 60-80 wt % of water. In one embodiment, the solutions include about 70 wt % to about 75 wt % of water. In one embodiment, the solutions include about 5 wt % of water. In one embodiment, the solutions include about 10 wt % of water. In one embodiment, the solutions include about 15 wt % of water. In one embodiment, the solutions include about 20 wt % of water. In one embodiment, the solutions include about 25 wt % of water. In one embodiment, the solutions include about 30 wt % of water. In one embodiment, the solutions include about 35 wt % of water. In one embodiment, the solutions include about 40 wt % of water. In one embodiment, the solutions include about 45 wt % of water. In one embodiment, the solutions include about 50 wt % of water. In one embodiment, the solutions include about 55 wt % of water. In one embodiment, the solutions include about 60 wt % of water. In one embodiment, the solutions include about 65 wt % of water. In one embodiment, the solutions include about 70 wt % of water. In one embodiment, the solutions include about 75 wt % of water. In one embodiment, the solutions include about 80 wt % of water. In one embodiment, the solutions include about 85 wt % of water. In one embodiment, the solutions include about 90 wt % of water.

(ii) Oxidizer

The etching solutions of the disclosed and claimed subject matter include an oxidizing agent (also referred to as an "oxidizer"). The oxidizer functions primarily to etch silicon-germanium alloy by forming a corresponding oxide (i.e., germanium or silicon). The oxidizing agent can be any suitable oxidizing agent. Suitable oxidizing agents include, but are not limited to, one or more peroxy-compounds, i.e., compounds that include at least one peroxy group (—O—O—). Suitable peroxy-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., iodates, periodates, and acids thereof, and mixtures thereof, and the like), perboric acid, perborates, peroxyacids (e.g., peracetic acid, perbenzoic acid, salts thereof, mixtures thereof, and the like), permanganates, cerium compounds, ferricyanides (e.g., potassium ferricyanide), mixtures thereof and the like.

In some embodiments, oxidizing agents include, but are not limited to, hydrogen peroxide, periodic acid, potassium iodate, potassium permanganate, ammonium persulfate, ammonium molybdate, ferric nitrate, nitric acid, potassium nitrate, ammonia, and mixtures thereof. In still other embodiments, oxidizing agents include hydrogen peroxide and urea-hydrogen peroxide. In some embodiments, the oxidizing agent is hydrogen peroxide.

In some embodiments, the weight percent (neat) of oxidizer in the etching solution is in a range with start and end points selected from the following group of numbers: 0.5, 1, 1.5, 2, 2.5, 3, 5, 8, 10, 12, 15, 20, 25, 30, 40, 45, 50, 55 and 60. In some embodiments, the oxidizer will be present in the solution in an amount from about 0.5% to about 30% by weight, or from about 0.5% to about 20% by weight, or from about 1.5% to about 20% by weight, or from % to about 20% by weight, or from 3% to about 15% by weight or from 6% to about 15% by weight, or from 6% to about 20% by weight, or from 3% to about 20% by weight of the solution. In another embodiment, the oxidizer will be present in the solution in an amount from about 3.0% to about 20% by weight. In another embodiment, the oxidizer will be present in the solution from about 5.0% to about 30% by weight. In another embodiment, the oxidizer will be present in the solution from about 5.0% to about 20% by weight. In another embodiment, the oxidizer will be present in the solution from about 10% to about 20% by weight. In another embodiment, the oxidizer will be present in the solution from about 10% to about 15% by weight. In another embodiment, the oxidizer will be present in the solution from about 10% to about 30% by weight. In another embodiment, the oxidizer will be present in the solution from about 20% to about 30% by weight.

(iii) Fluoride Ion Source

The etching solutions of the present disclosure also includes one or more sources of fluoride ion. Fluoride ion functions principally to assist in removal of silicon or germanium oxide that has formed upon action of the oxidizer. Typical compounds that provide a fluoride ion source according to the disclosed and claimed subject matter are hydrofluoric acid, ammonium fluoride, quaternary ammonium fluorides, fluoroborates, fluoroboric acid, tetrabutylammonium tetrafluoroborate, aluminum hexafluoride, and a fluoride salt of an aliphatic primary, secondary or tertiary amine having the formula:

$$R^1NR^2R^3R^4F$$

where $R^1$, $R^2$, $R^3$ and $R^4$ individually represent H or a ($C_1$-$C_4$) alkyl group. Typically, the total number of carbon atoms in the $R^1$, $R^2$, $R^3$ and $R^4$ groups is 12 carbon atoms or less. Examples of fluoride salts of an aliphatic primary, secondary or tertiary amine such as, for example, tetramethylammonium fluoride, tetraethylammonium fluoride, methyltriethylammonium fluoride, and tetrabutylammonium fluoride.

In selecting the source of the fluoride ion, consideration should be given as to whether or not the source releases ions that would adversely affect the surface being cleaned. For example, in cleaning semiconductor elements, the presence of sodium or calcium ions in the cleaning solution can have an adverse effect on the surface of the element. In some embodiments, the fluoride ion source is ammonium fluoride or ammonium bifluoride.

Without being bound by theory, it is believed that the amount of the compound used as the source of the fluoride ion in the cleaning solution will, for most applications, include, about 0.01% to about 8% by weight or from about 0.01% to about 20% by weight of a solution 40% ammonium fluoride, or stoichiometric equivalent thereof. Preferably, the compound includes from about 0.02% to about 8% by weight, more preferably from about 0.02% to about 6% by weight, still more preferably, about 1 to about 8% by weight, and most preferably, from about 0.025% to about 5% by weight of a solution of about 40% ammonium fluoride. In some embodiments, the solution will include about 0.01% to about 8% by weight or about 0.01% to about 7% by weight of a fluoride ion source, which may be provided by a 40% ammonium fluoride solution. Preferably, the compound includes from about 0.02% to about 6% by weight of a fluoride ion source and, most preferably, from about 0.025% to about 5% or from about 0.04% to about 2.5% by weight of a fluoride ion source or or from about 0.02% to about 1.5% by weight of a fluoride ion source or from about 0.05% to about 15% by weight of a solution of 40% ammonium fluoride, most preferably, from about 0.0625% to about 12.5% or from about 0.1% to about 6.25% by weight of a solution of 40% ammonium fluoride. It should be understood that the amount of fluoride ion used will typically depend, however, on the particular substrate being cleaned. For example, in certain cleaning applications, the amount of the fluoride ion can be relatively high when cleaning substrates that include dielectric materials that have a high resistance to fluoride etching. Conversely, in other applications, the amount of fluoride ion should be relatively low, for example, when cleaning substrates that include dielectric materials that have a low resistance to fluoride etching.

For the purposes of clarity, the amount of the source of the fluoride ion in the cleaning solution, based on the addition of the fluoride ion source only (neat) includes, a weight percent in range having start and end points selected from the following list of weight percents: 0.001, 0.0016, 0.002, 0.0025, 0.004, 0.008, 0.01, 0.02, 0.025, 0.04, 0.05, 0.1, 0.4, 0.6, 1, 2, 2.4, 2.5, 2.8, 3.2, 5, 6, 10, 12, 15, and 20. For examples the amount of fluoride ion source (neat) in the solution may be from about 0.004 to about 3.2% by weight or from about 0.004% to about 2.8% by weight. The solution includes from about 0.008% to about 3.2% by weight, or from about 0.008% to about 2.4% by weight, or about 0.4% to about 3.2% by weight, or from about 0.01% to about 2% by weight, or 0.01% to about 10% by weight, or 0.01% to about 5% by weight of a fluoride ion source. In some embodiments, the solution will include about 0.004% to about 3.2% by weight of a fluoride ion source. The solution includes fluoride ion source or from about 0.001% to about 2% or from about 0.0016% to about 1% by weight of a fluoride ion source or from about 0.002 to about 6% by weight, or from about 0.0025% to about 5% or from about 0.04% to about 0.025% by weight. In yet other embodiments, the solution includes about 0.05% to about 20% by weight or about 0.1% to about 15%, or from about 0.1% to about 20%, or from about 0.01% to about 20%, or about 0.1% to about 10% or about 0.1% to about 5%, or from about 0.6% to about 12% or from about 1% to about 20% or from about 1% to about 15% or from about 1% to about 10% by weight of a fluoride ion source based on a neat fluoride ion source.

(iv) Polyfunctional Acid

The etching solutions include one or more polyfunctional acids which includes both organic and inorganic acids. Polyfunctional organic acids refers to an acid or a multi-acid that has more than one carboxylate group, including but not limited to, (i) dicarboxylate acids (e.g., malonic acid, malic acid, etc.); dicarboxylic acids with aromatic moieties (e.g., phthalic acid et al), and combinations thereof; and (ii) tricarboxylic acids (e.g., citric acid, etc.), tricarboxylic acids with aromatic moieties (e.g., trimellitic acid, etc.) and combinations thereof. Polyfunctional inorganic acids refers to polyprotic acids having the ability to lose more than one proton per molecule in acid-base reactions (i.e., acids that have more than one ionizable $H^+$ atom per molecule such as $H_2SO_4$).

In one embodiment, the polyfunctional acid includes only one or more polyfunctional organic acids (i.e., includes no polyfunctional inorganic acids). In another embodiment, the polyfunctional acid includes only one or more polyfunctional inorganic acids. (i.e., includes no polyfunctional organic acids). In another embodiment, the polyfunctional acid includes both one or more polyfunctional organic acids and one or more polyfunctional inorganic acids.

Polyfunctional Organic Acids

Useful dicarboxylic acids include oxalic acid, malonic acid, succinic acid, glutaric acid, adipic acid, pimelic acid, suberic acid, azelaic acid and sebacic acid.

In some embodiments, the polyfunctional organic acids are polyprotic acids having at least three carboxylic acid groups. Such acids have at least a second and a third dissociation constant, each of which is higher relative to its respective preceding constant. This indicates that the acid loses a first proton more easily than a second one, because the first proton separates from an ion of a single negative charge, whereas the second proton separates from the ion of a double negative charge. Without being bound by theory, it is believed that the double negative charge strongly attracts the proton back to the acid ion. A similar relationship exists between the second and third separated protons. Thus, polyprotic acids such as, for example, those having at least three carboxylic acid groups are useful in controlling the pH of a solution, particularly at a pH corresponding to their higher pKa value. Therefore, in addition to having a pKa value of about 5 to about 7, preferred polyprotic acids of the disclosed and claimed subject matter have multiple pKa values, wherein the highest pKa is from about 3 to about 7.

Polyprotic acids having at least three carboxylic acid groups according to the disclosed and claimed subject matter are highly compatible with polyhydric solvents. Examples of preferred polyprotic acids include tricarboxylic acids (e.g., citric acid, 2-methylpropane-1,2,3-triscarboxylic, benzene-1,2,3-tricarboxylic [hemimellitic], propane-1,2,3-tricarboxylic [tricarballylic], 1,cis-2,3-propenetricarboxylic acid [aconitic], and the like), tetracarboxylic acids (e.g., butane-1,2,3,4-tetracarboxylic, cyclopentanetetra-1,2,3,4-carboxylic, benzene-1,2,4,5-tetracarboxylic [pyromellitic], and the like), pentacarboxlyic acids (e.g., benzenepentacarboxylic), and hexacarboxylic acids (e.g., benzenehexacarboxylic [mellitic]), and the like. The respective pKa values of these acids are provided in Table 1. Particularly preferred polyprotic acids include tricarboxylic acids, with citric acid being most preferred.

TABLE 1

| | pKa value at 25° C. | | | | | |
|---|---|---|---|---|---|---|
| Acid | pK1 | pK2 | pK3 | pK4 | pK5 | pK6 |
| Citric Acid | 3.13 | 4.76 | 6.40 | — | — | — |
| 2-Methylpropane-1,2,3-triscarboxylic | 3.53 | 5.02 | 7.20 | — | — | — |
| Benzene-1,2,3-tricarboxylic (hemimellitic) | 2.98 | 4.25 | 5.87 | — | — | — |
| Propane-1,2,3-tricarboxylic (tricarballylic) | 3.67 | 4.84 | 6.20 | — | — | — |
| 1,cis-2,3-Propenetricarboxylic acid, (aconitic) | 3.04 | 4.25 | 5.89 | — | — | — |
| Butane-1,2,3,4-tetracarboxylic | 3.36 | 4.38 | 5.45 | 6.63 | — | — |
| Cyclopentanetetra-1,2,3,4-carboxylic | 3.07 | 4.48 | 5.57 | 10.06 | — | — |
| Benzene-1,2,4,5-tetracarboxylic (pyromellitic) | 2.43 | 3.13 | 4.44 | 5.61 | — | — |
| Benzenepentacarboxylic | 2.34 | 2.95 | 3.94 | 5.07 | 6.25 | — |
| Benzenehexacarboxylic (mellitic) | 2.08 | 2.46 | 3.24 | 4.44 | 5.50 | 6.59 |

Citric acid, which is a preferred polyprotic acid, is a tricarboxylic acid having three pKa values: 3.13, 4.76, and 6.40, corresponding to trihydrogencitrate ions, dihydrogencitrate ions, and monohydrogen citrate ions, respectively. In certain preferred embodiments of the disclosed and claimed subject matter, the polyfunctional organic acid includes a salt of citric acid, with especially preferred examples including aqueous solutions of ammonium citrate tribasic (TAC) and citric acid.

In alternative embodiments, other polyfunctional organic acids (as just-described for citric acid) may be used in the solutions of the disclosed and claimed subject matter, with their respective salts, commonly ammonium salts of the respective polyfunctional acids, for examples, malonic acid and malonic acid, ammonium salt; oxalic acid and ammonium oxalate; and succinic acid and ammonium succinate and so forth.

Polyfunctional Inorganic Acids

Useful polyfunctional inorganic acids (i.e., polyprotic acids) include one or more of:

TABLE 2

| Name | Formula | $pK_{a1}$ | $pK_{a2}$ | $pK_{a3}$ | $pK_{a4}$ |
|---|---|---|---|---|---|
| Diprotic Acids | | | | | |
| Boric Acid | $H_3BO_3$ | 9.27 | 14 | — | — |
| Carbonic Acid | $H_2CO_3$ | 6.35 | 10.33 | — | — |
| Phosphorous Acid | $H_3PO_3$ | 1.3 | 6.7 | — | — |
| Silicic Acid | $H_2SiO_3$ | 9.91 | 11.81 | — | — |
| Sulfurous Acid | $H_2SO_3$ | 1.85 | 7.20 | — | — |
| Sulfuric Acid | $H_2SO_4$ | −3 | 1.99 | — | — |
| Triprotic acids | | | | | |
| Phosphoric Acid | $H_3PO_4$ | 2.16 | 7.21 | 12.32 | — |
| Tetraprotic acids | | | | | |
| Pyrophosphoric Acid | $H_4P_2O_7$ | 0.91 | 2.10 | 6.70 | 9.32 |
| Orthosilicic Acid | $H_4SiO_4$ | 9.9 | 11.8 | 12 | 12 |

In one embodiment, the polyfunctional inorganic acids includes $H_3PO_4$.

The amount of polyfunctional acids in the solutions of the disclosed and claimed subject matter is in a percent weight, based on the total weight of the solution, within any range having start and end points selected from the following: 0.1, 0.25, 0.4, 0.5, 0.6, 0.8, 0.9, 1, 1.5, 2, 3, 4 and 5, for examples, from about 10% to about 30% by weight of the solution, or from about 20% to about 30% or from about 0.5% to about 10%, or from about 0.5% to about 5%, or from about 0.5% to about 8% or from about 0.5% to about 3 by weight of the about 0.1 wt % to 5 wt %, preferably from 0.25 wt % to 3 wt %, and more preferably from 0.5 wt % to 2.0 wt %. In one embodiment, that the amount of polyfunctional acids in the solution is from about 0.5 wt % to about 1.5 wt %.

For examples, the conjugate base may be present in the solution in a percent weight, based on the total weight of the solution within any range having start and end points selected from the following: 0.1, 0.25, 0.4, 0.5, 0.6, 0.8, 0.9, 1, 1.5, 2, 3, 4 and 5, for examples, from about 10% to about 30% by weight of the solution, or from about 20% to about 30% or from about 0.5% to about 10%, or from about 0.5% to about 5%, or from about 0.5% to about 8% or from about 0.5% to about 3 by weight of the about 0.1 wt % to 5 wt %, preferably from 0.25 wt % to 3 wt %, and more preferably from 0.5 wt % to 2.0 wt %. In some embodiments, if the conjugate base (such as the ammonium salt) to the polyfunctional acid is present in the solution, it may be present in a 10:1 to 1:10 weight ratio, or 5:1 to 1:5 weight ratio based on the amount of the polyfunctional acid present in the solution.

Preferably, the disclosed etching solutions are acidic. In some embodiments, the pH is from about 2 to about 7 or from about 4 to about 6.5.

(v) Corrosion Inhibiting Surfactant

The etching solutions of the disclosed and claimed subject matter include at least one corrosion inhibiting surfactant. The corrosion inhibiting surfactant functions to protect the silicon from etching. Surfactants for use in the solutions described herein include, but are not limited to, amphoteric salts, cationic surfactants, anionic surfactants, zwitterionic surfactants, non-ionic surfactants, and combinations thereof including, but not limited to, bis(2-ethylhexyl)phosphate, perfluoroheptanoic acid, prefluorodecanoic acid, trifluoromethanesulfonic acid, phosphonoacetic acid, dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, dodecyl phosphate.

Non-ionic surfactants contemplated include, but are not limited to, polyoxyethylene lauryl ether (Emalmin NL-100 (Sanyo), Brij 30, Brij 98, Brij 35), dodecenylsuccinic acid monodiethanol amide (DSDA, Sanyo), ethylenediamine tetrakis(ethoxylate-block-propoxylate) tetrol (Tetronic 90R4), polyethylene glycols (e.g., PEG 400), polypropylene glycols, polyethylene or polypropylene glycol ethers, block copolymers based on ethylene oxide and propylene oxide (Newpole PE-68 (Sanyo), Pluronic L31, Pluronic 31R1, Pluronic L61, Pluronic F-127), polyoxypropylene sucrose ether (SN008S, Sanyo), t-octylphenoxypolyethoxyethanol (Triton X100), 10-ethoxy-9,9-dimethyldecan-1-amine (TRITON® CF-32), Polyoxyethylene (9) nonylphenylether, branched (IGEPAL CO-250), polyoxyethylene (40) nonylphenylether, branched (IGEPAL CO-890), polyoxyethylene sorbitol hexaoleate, polyoxyethylene sorbitol tetraoleate, polyethylene glycol sorbitan monooleate (Tween 80), sorbitan monooleate (Span 80), a combination of Tween 80 and Span 80, alcohol alkoxylates (e.g., Plurafac RA-20), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and ethoxylated fluorosurfactants (ZONYL® FSO-100, ZONYL® FSN-100) nonionic polyoxyethylene substituted acetylene glycol surfactants which are available commercially under general trade designation SURFYNOL® such as SURFYNOL® 104, 82, 465 and 485. One preferred surfactant is SURFYNOL® 485.

Cationic surfactants contemplated include, but are not limited to, cetyl trimethylammonium bromide (CTAB), heptadecanefluorooctane sulfonic acid, tetraethylammonium, stearyl trimethylammonium chloride (Econol TMS-28, Sanyo), 4-(4-diethylaminophenylazo)-1-(4-nitrobenzyl) pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, Aliquat® 336 and oxyphenonium bromide, guanidine hydrochloride ($C(NH_2)_3Cl$) or triflate salts such as tetrabutylammonium trifluoromethanesulfonate, dimethyldioctadecylammonium chloride, dimethyldihexadecylammonium bromide and di(hydrogenated tallow)dimethylammonium chloride (e.g., Arquad 2HT-75, Akzo Nobel).

In some embodiments, the cationic surfactant, if employed, includes polyalkylencimine. Preferably, the polyalkyleneimine is a polyethyleneimine (PEI). Any PEI may be used, but it is preferred that a homopolymeric polyethyleneimine is employed. The PEI may be branched or linear, but preferably it is branched.

While it has been found that the PEI used may have any formula weight for effectiveness, preferably the PEI has a lower formula weight (FW). In an embodiment, the PEI has a FW between 100 and 50,000, between 400 and 25,000, between 800 and 10,000, or between 1000 and 3000.

In an embodiment, the polyalkyleneimine includes a polyethyleneimine (PEI) and preferably the PEI includes less than 1% by weight of the solution, preferably less than 0.5% by weight, or less than 0.25% by weight or from about 0.1% to about 1% by weight of the solution. Preferably the PEI has a molecular weight between 100 and 2500, preferably 200 and 1500 and most preferably between 400 and 1200.

In a preferred embodiment, the polyalkyleneimine has a molecular weight between 100 and 2500, between 200 and 1500, between 400 and 1200, or between 700 and 900. A molecular weight of 800 is particularly suitable. The molecular weight is suitably determined by light scattering techniques known in the art.

Polyethyleneimines are commercially available, for example Lupasol® 800 which is supplied by BASF.

Anionic surfactants contemplated include, but are not limited to, ammonium polyacrylate (e.g., DARVAN 821A), modified polyacrylic acid in water (e.g., SOKALAN CP10S), phosphate polyether ester (e.g., TRITON H-55), decylphosphonic acid, dodecylphosphonic acid (DDPA), tetradecylphosphonic acid, hexadecylphosphonic acid, octadecylphosphonic acid, dodecylbenzenesulfonic acid, poly (acrylic acid sodium salt), sodium polyoxyethylene lauryl ether, sodium dihexylsulfosuccinate, dicyclohexyl sulfosuccinate sodium salt, sodium 7-ethyl-2-methyl-4-undecyl sulfate (Tergitol 4), SODOSIL RM02, and phosphate fluorosurfactants such as Zonyl FSJ and ZONYL® UR.

Zwitterionic surfactants include, but are not limited to, acetylenic diols or modified acetylenic diols (e.g., SURFONYL® 504), cocamido propyl betaine, ethylene oxide alkylamines (AOA-8, Sanyo), N,N-dimethyldodecylamine N-oxide, sodium cocaminpropinate (LebonApl-D, Sanyo), 3-(N,N-dimethylmyristylammonio)propanesulfonate, and (3-(4-heptyl)phenyl-3-hydroxypropyl)dimethylammoniopropanesulfonate. Preferably, the at least one surfactant includes dodecylbenzene sulfonic acid, dodecyl phosphonic acid, dodecyl phosphate, TRITON X-100, SOKALAN CP10S, PEG 400, and PLURONIC F-127. In one embodiment, a preferred surfactant is an ethoxylated acetylenic diol such as SURFONYL® 485.

In some embodiments, mixtures of surfactants may be used in the solutions of the disclosed and claimed subject matter. For example, in some of the solutions of the disclosed and claimed subject matter, the surfactants includes mixtures of acetylenic diols or modified acetylenic diols and polyalkyleneimine. In one embodiment, the solutions include two or more of PEG-400, Lupasol® 800 and Surfynol® 485.

When present, the total amount of surfactant is present in a range from about 0.001 wt % to about 1 wt %, preferably about 0.1 wt % to about 1 wt %, based on the total weight of the solution. Alternatively, and without being bound by theory, it is believed that for some applications, if present, the one or more surfactants will include from about 0.1 wt. % to about 15 wt. % of the solution; or from about 0.1 wt. % to about 10 wt. %, or from about 0.5 wt. % to about 5 wt. %, or from about 0.1 wt. % to about 1 wt. %, or about 0.5 wt. % to about 1 wt. % of the solution. In alternative embodiments the weight percent of surfactant in the solution, based on the total weight of the solution may be within any range having start and end points selected from the following: 0.1, 0.2, 0.5, 0.9, 1, 1.5, 2, 4, 5, 8, 10, 12 and 15.

(vi) Silane Silicon Oxide Etch Inhibitor

The etching solutions of the disclosed and claimed subject matter include at least one silane silicon oxide etch inhibitor. Examples of suitable and/or preferred silane silicon oxide etch inhibitor include methyltrimethoxysilane, ethyltrimethoxysilane, triethoxy(ethyl)silane, vinyltrimethoxysilane, trimethoxyphenylsilane, triethoxymethylsilane, trimethoxy(octyl)silane, propyltrimethoxysilane, isobutyl(trimethoxy)silane, trimethoxysilane, n-propyltriethoxysilane, trimethoxy(octadecyl)silane, hexadecyltrimethoxysilane, methyl(tripropyl)silane, ethyl(tripropyl)silane and propyl(tripropyl)silane.

In one embodiment, at least one silane silicon oxide etch inhibitor includes silicic acid.

In one embodiment, the at least one silane silicon oxide etch inhibitor includes a silicon-containing compound of Formula I Formula I

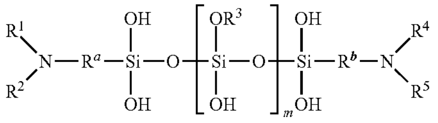

where (i) each of $R^a$ and $R^b$ is $—C_3H_6—$, (ii) each of $R^1$, $R^2$, $R^4$ and $R^5$ is —H and (iii) m=0-20. In one aspect of this embodiment, the silicon-containing compound of Formula I having the following formula (hereinafter "Si Compound 1"):

Si Compound 1

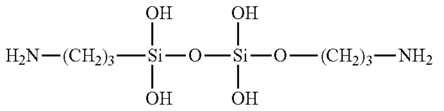

In one embodiment, the at least one silane silicon oxide etch inhibitor includes methyltrimethoxysilane.

The amount of at least one silane silicon oxide etch inhibitor in the solutions of the disclosed and claimed subject matter is in a percent weight, based on the total weight of the solution, within any range having start and end points selected from the following: 0.1, 0.25, 0.4, 0.5, 0.6, 0.8, 0.9, 1, 1.5, 2, 3, 4 and 5, for examples, from about 10% to about 30% by weight of the solution, or from about 20% to about 30% or from about 0.5% to about 10%, or from about 0.5% to about 5%, or from about 0.5% to about 8% or from about 0.5% to about 3 by weight of the about 0.1 wt % to 5 wt %, preferably from 0.25 wt % to 3 wt %, and more preferably from 0.5 wt % to 2.0 wt %. In one embodiment, that the amount of polyfunctional acids in the solution is from about 0.5 wt % to about 1.5 wt %. In one embodiment, the amount of the at least one silane silicon oxide etch inhibitor in the solution is from about 0.01 wt % to about 1.0 wt %.

(vii) Optional Water-Miscible Organic Solvent

The etching solutions of the disclosed and claimed subject matter may optionally include at least one water-miscible organic solvent. Examples of water-miscible organic solvents that can be employed are ethylene glycol, propylene glycol, butyl diglycol, 1,4-butanediol, tripropylene glycol methyl ether, propylene glycol propyl ether, diethylene gycol n-butyl ether (e.g., commercially available under the trade designation Dowanol DB), hexyloxypropylamine, poly(oxyethylene)diamine, dimethylsulfoxide, tetrahydrofurfuryl alcohol, glycerol, alcohols, sulfoxides, sulfolane or mixtures thereof. Preferred solvents may be alcohols, diols, or mixtures thereof. In some embodiments the preferred solvents may be sulfolane or sulfoxides, such as dimethylsulfoxide. In some embodiments, the preferred solvents are diols such as, for example, propylene glycol. In other embodiments the preferred solvents are glycol ethers.

In some embodiments of the disclosed and claimed subject matter, the water-miscible organic solvent includes a glycol ether. Examples of glycol ethers include butyl diglycol, ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monoethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether (DPM), dipropylene glycol monopropyl ether, dipropylene glycol monoisopropyl ether, dipropylene monobutyl ether, dipropylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol. In one embodiment, the at least one water-miscible solvent includes propylene glycol (PG). In one embodiment, the at least one water-miscible solvent includes ethylene glycol (EG). In one embodiment, the at least one water-miscible solvent includes dipropylene glycol monomethyl ether (DPM).

In some embodiments, the water miscible organic solvent in the solution of the disclosed and claimed subject matter includes glycol ethers, such as, butyl diglycol or dipropylene glycol monomethyl ether. In some embodiments, the preferred solvents may be alcohols, diols, or mixtures thereof. In some embodiments, the preferred solvents are diols such as, for example, propylene glycol. In other embodiments the preferred solvents are glycol ethers, such as dibutyl glycol. In some embodiments the preferred solvents may be sulfolane or sulfoxides, such as dimethylsulfoxide. Mixtures of these and other solvents may be used.

For most applications, the amount of water-miscible organic solvent in the solution may be in a range having start and end points selected from the following list of weight percents: 0.5, 1, 5, 7, 10, 12, 15, 20, 25, 30, 35, 40, 45, 50, 55, 59.5, 60, 65, 70, 75 and 80. Examples of such ranges of solvent include from about 0.5% to about 59.5% by weight; or from about 1% to about 50% by weight; or from about 1% to about 40% by weight; or from about 0.5% to about 30% by weight; or from about 1% to about 30% by weight; or from about 5% to about 30% by weight; or from about 5% to about 15% by weight; or from about 7% to about 12% by weight or from about 7% to about 80% by weight, or from about 20% to about 60% by weight, or from about 10% to about 50% by weight, or from about 10% to about 45% by weight, or from about 10% to about 35% by weight, or from about 15% to about 50% by weight, or from about 15% to about 35% by weight of the solution. In one embodiment, the water-miscible organic solvent in the solution is about 3 wt %. In one embodiment, the water-miscible organic solvent in the solution is about 3 wt %. In one embodiment, the water-miscible organic solvent in the solution is about 5 wt %. In one embodiment, the water-miscible organic solvent in the solution is about 10 wt %. In one embodiment, the water-miscible organic solvent in the solution is about 15 wt %. In one embodiment, the water-miscible organic solvent in the solution is about 20 wt %. In one embodiment, the water-miscible organic solvent in the solution is about 25 wt %. In one embodiment, the water-miscible organic solvent in the solution is about 30 wt %. In one embodiment, the water-miscible organic solvent in the solution is about 35 wt %. In one embodiment, the water-miscible organic solvent in the solution is about 40 wt %. In one embodiment, the water-miscible organic solvent in the solution is about 45 wt %. In one embodiment, the water-miscible organic solvent in the solution is about 50 wt %. In one embodiment, the water-miscible organic solvent in the solution is about 55 wt %. In one embodiment, the water-miscible organic solvent in the solution is about 60 wt %. In one embodiment, the water-miscible organic solvent in the solution is about 65 wt %. In one embodiment, the water-miscible organic solvent in the solution is about 70 wt %. In one embodiment, the water-miscible organic solvent in the solution is about 75 wt %.

Other Optional Ingredients

The etching solutions of the disclosed and claimed subject matter may also include one or more of the following additives: chelating agents, chemical modifiers, dyes, biocides, and other additives. The additive(s) may be added to the extent that they do not adversely affect the performance of the solution.

Another optional ingredient that can be used in the etching solution is a metal chelating agent; it can function to increase the capacity of the solution to retain metals in solution and to enhance the dissolution of metallic residues. Typical examples of chelating agents useful for this purpose are the following organic acids and their isomers and salts: ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl) ethylenediaminetriacetic acid (HEDTA), N, N,N',N'-ethylenediaminetetra(methylenephosphonic) acid (EDTMP), triethylenetetraminchexaacetic acid (TTHA), 1,3-diamino-2-hydroxypropane-N,N,N',N'-tetraacetic acid (DHPTA), methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, propyl gallate, pyrogallol, 8-hydroxyquinoline, and cysteine. Preferred chelating agents are aminocarboxylic acids such as EDTA, CyDTA and aminophosphonic acids such as EDTMP.

Without being bound by theory, it is believed that the chelating agent, if present, will be in the solution in an amount of from about 0.1 wt. % to about 10 wt. %, preferably in an amount of from about 0.5 wt. % to about 5 wt. % of the solution.

In some embodiments the solutions of the disclosed and claimed subject matter will be free of or substantially free of any or all of the above-listed chelating agents added to the composition.

Other commonly known components such as dyes, biocides etc. can be included in the cleaning solution in conventional amounts, for example, amounts up to a total of about 5 weight % of the solution.

In some embodiments, the solution may be substantially free of or free of one or more of the following: hydroxides, metal hydroxides, such as KOH or LiOH or NaOH. Quaternary ammonium hydroxide, alkanolamine, inhibitors such nitrogen or sulfur containing, heterocyclic molecules such as thiazoles, abrasives, In other embodiments, the solution may be substantially free of or free of a halide-containing compound other than one or more fluorine-containing compounds, for example it may be substantially free or free of one or more of the following: bromine-, chlorine- or iodine-containing compounds. In other embodiments, the solution may be substantially free or free of sulfonic acid and/or phosphoric acid and/or sulfuric acid and/or nitric acid and/or hydrochloric acid. In other embodiments, the solution may be substantially free or free of sulfates and/or nitrates and/or sulfites and/or nitrites. In other embodiments, the solution may be substantially free or free of: ammonium hydroxide and/or ethyl diamine. In other embodiments, the solution may be substantially free or free of: sodium-containing compounds and/or calcium-containing compounds and/or manganese-containing compounds or magnesium-containing compounds and/or chromium-containing compounds and/or sulfur-containing compounds.

Other commonly known components such as dyes, biocides etc. can be included in the cleaning solution in conventional amounts, for example, amounts up to a total of about 5 weight % of the solution.

The etching solution of the disclosed and claimed subject matter is typically prepared by mixing the components together in a vessel at room temperature until all solids have dissolved in the aqueous-based medium.

Performance

As noted above, the etching solution of the disclosed and claimed subject matter exhibit (i) high selectivity of the etch for silicon-germanium over silicon and (ii) high selectivity of the etch for silicon-germanium over silicon oxide.

The etching solution of the disclosed and claimed subject matter exhibit high selectivity of the etch for silicon-germanium over silicon. In one embodiment, the selectivity is greater than about 50. In one embodiment, the selectivity is greater than about 65. In one embodiment, the selectivity is greater than about 80. In one embodiment, the selectivity is greater than about 100. In one embodiment, the selectivity is greater than about 150. In one embodiment, the selectivity is greater than about 200. In one embodiment, the selectivity is greater than about 250. In one embodiment, the selectivity is greater than about 300. In one embodiment, the selectivity is greater than about 350. In one embodiment, the selectivity is greater than about 400. In one embodiment, the selectivity is greater than about 450. In one embodiment, the selectivity is greater than about 500.

The etching solution of the disclosed and claimed subject matter also exhibit high selectivity of the etch for silicon-germanium over silicon oxide. In one embodiment, the selectivity is greater than about 50. In one embodiment, the selectivity is greater than about 65. In one embodiment, the selectivity is greater than about 80. In one embodiment, the selectivity is greater than about 100. In one embodiment, the selectivity is greater than about 150. In one embodiment, the selectivity is greater than about 200. In one embodiment, the selectivity is greater than about 250. In one embodiment, the selectivity is greater than about 300. In one embodiment, the selectivity is greater than about 350. In one embodiment, the selectivity is greater than about 400. In one embodiment, the selectivity is greater than about 450. In one embodiment, the selectivity is greater than about 500.

Method

In another aspect, the disclosed and claimed subject matter provides a method of selectively enhancing the etch rate of silicon-germanium relative to silicon on a microelectronic (composite semiconductor) device including silicon and silicon-germanium. The method includes, consists essentially of or consists of the steps of:

(a) contacting a microelectronic (composite semiconductor) device including silicon and silicon-germanium with an etching solution described herein;
(b) rinsing the microelectronic (composite semiconductor) device after the silicon-germanium is at least partially removed; and
(c) optionally drying the microelectronic.

In a further aspect, the method includes the drying step (c). "At least partially removed" means removal of at least 50% of the material, preferably at least 80% removal. Most preferably, 100% removal of silicon-germanium is achieved using the solutions of the disclosed and claimed subject matter.

Contacting step (a) can be carried out in any suitable manner such as, for example, immersion, spray, or via a single wafer process. The temperature of the solution during contacting step (a) is preferably from about 25° C. to about 100° C. and more preferably from about 30° C. to about 50° C. The contacting time can be an suitable time, but is generally from about 1 minute to about 60 minutes.

Rinsing step (b) may be carried out in any suitable manner, for example, rinsing the substrate with de-ionized water by immersion or spray techniques. In preferred embodiments, the rinsing step may be carried out employing a mixture of de-ionized water and an organic solvent such as, for example, isopropyl alcohol.

Drying step (c) may carried out in any suitable manner, for example, isopropyl alcohol (IPA) vapor drying, heat, or by centripetal force.

When used in the method, the solutions of the disclosed and claimed subject matter exhibit the selectively of etch described above.

The features and advantages are more fully shown by the illustrative examples discussed below.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Materials and Methods

All materials used in this patent were purchased from and/or are available from Sigma Aldrich and were used in the formulations as received.

Etching tests were run using 100 g of the etching compositions in a 250 mL beaker with a ½" round Teflon stir bar set at 400 rpm. The etching compositions were heated to a temperature of about 45° C. on a hot plate. The test coupons were immersed in the compositions for about 20 minutes while stirring.

The segments were then rinsed for 3 minutes in a DI water bath or spray and subsequently dried using filtered nitrogen. The silicon, silicon oxide and silicon-germanium etch rates (Å/minute) were estimated from changes in the thickness before and after etching and was measured by spectroscopic ellipsometry (SCI FilmTek SE2000). Typical starting layer thickness was 1000 Å for Si and silicon oxide and 1000 Å for SiGe.

General Procedure for Preparing the Cleaning Solutions

All solutions which are the subject of the present Examples were prepared by mixing the components in a 250 ml beaker with a 1" Teflon-coated stir bar. Typically, the first material added to the beaker was deionized (DI) water followed by the other components in no particular order. Typically, the oxidizer (e.g., hydrogen peroxide) is added just prior to use.

Solutions

Table 3 shows the effect of different Si containing molecules on SiGe and SiO etch rates. In Table 3, Ex. 1 had high selectivity of SiGe over SI. However, Ex. 1 had high $SiO_2$ etch rates which resulted in low selectivity of SiGe over $SiO_2$. Addition of Si containing molecules like silicic acid and Si Compound 1 significantly decreased $SiO_2$ etch rates. However, SiGe etch rates were also significantly decreased. The addition of methyltrimethoxysilane notably decreased $SiO_2$ etch rates while only slightly decreased SiGe etch rates.

TABLE 3

| Raw Material | Ex. 1 | Ex. 2 | Ex. 3 | Ex. 4 |
|---|---|---|---|---|
| DIW | 63.7 | 63.7 | 63.7 | 63.7 |
| Phosphoric Acid | 0.6 | 0.6 | 0.6 | 0.6 |
| $NH_4F$ (40%) | 0.3 | 0.3 | 0.3 | 0.3 |
| PEG-400 | 0.2 | 0.2 | 0.2 | 0.2 |
| Lupasol ® 800 | 0.2 | 0.2 | 0.2 | 0.2 |
| $H_2O_2$ (30%) | 35 | 35 | 35 | 35 |
| Silicic Acid | — | 0.5 | — | — |
| Si Compound 1: | — | — | 0.5 | — |
| 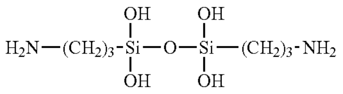 | | | | |
| Methyltrimethoxysilane | — | — | — | 0.1 |
| SiGe (25%) e/r @ 40° C. | 86.7 | 4.3 | 6.1 | 79.3 |
| poly Si e/r @ 40° C. | 0.6 | 0.8 | 1.6 | 0.6 |
| TEOS e/r @ 40° C. | 15.9 | 0.2 | 0.4 | 1.2 |

When citric acid was used as polyfunctional acid, methyltrimethoxysilane addition also decreased $SiO_2$ etch rates significantly with almost no obvious change in SiGe etch rates. Si etch rates were also not obviously changed and very low. Table 4 illustrates the use of citric acid as the polyfunctional acid for selectivity of SiGe over $SiO_2$.

TABLE 4

| Raw Material | Ex. 5 | Ex. 6 | Ex. 7 |
|---|---|---|---|
| DIW | 46.1 | 6.1 | 1.1 |
| Propylene Glycol | 0 | 0 | 5 |
| Citric Acid | 1 | 1 | 1 |
| PEG-400 | 0.2 | 0.2 | 0.2 |
| Lupasol ® 800 | 0.2 | 0.2 | 0.2 |
| Hydrofluoric Acid (HF) (5%) | 2 | 2 | 2 |
| $NH_4F$ (40%) | 0.5 | 0.5 | 0.5 |
| Methyltrimethoxysilane (1%) | 0 | 40 | 40 |
| $H_2O_2$ | 50 | 50 | 50 |
| SiGe (25% ) e/r @ 50 C. | 383.2 | 376.3 | 380.7 |
| poly Si e/r @ 50 C. | 2.5 | 1.7 | 1.8 |
| TEOS e/r @50 C. | 43.2 | 0.1 | 0.3 |

Table 5 illustrates another embodiment of an etching solution according to the disclosed and claimed subject matter.

TABLE 5

| Component | Raw Material | RM assay | CAS No. | Ex. 8 |
|---|---|---|---|---|
| (i) | DIW | — | 7732-18-5 | 21.3 |
| (ii) | $H_2O_2$ | 30 | 7722-84-1 | 50 |
| (iii) | Hydrofluoric Acid (HF) | 5 | 7664-39-3 | 2 |
| (iii) | $NH_4F$ | 40 | 12125-01-8 | 0.5 |

TABLE 5-continued

| Component | Raw Material | RM assay | CAS No. | Ex. 8 |
|---|---|---|---|---|
| (iv) | Citric acid | 100 | 77-92-9 | 0.8 |
| (v) | PEG-400 | 100 | 25322-68-3 | 0.2 |
| (v) | Lupasol ® 800 | 100 | 25987-06-8 | 0.2 |
| (vi) | Methyltrimethoxysilane | 2 | 1185-55-3 | 15 |
| (vii) | PG (propylene glycol) | 100 | 57-55-6 | 10 |

Table 6 illustrates the effect of temperature on the use of the formulation of Ex. 8. As shown, the processing temperature did not have significant effect on silicon oxide and silicon etch rates while SiGe etch rates increased with increase in processing temperature and therefore the selectivity of SiGe over silicon and silicon oxide.

TABLE 6

| Ex. 8 | 25° C. | 30° C. | 35° C. | 40° C. | 45° C. | 50° C. |
|---|---|---|---|---|---|---|
| SiGe (25%) e/r | 29.6 | 47.7 | 104.8 | 162.3 | 260.6 | 394.3 |
| PolySi e/r | 0.3 | 0.3 | 0.5 | 0.4 | 0.5 | 0.8 |
| TEOS e/r | | | <1 | | | |
| SiGe/Poly Si selectivity | 98.6 | 176.8 | 227.8 | 405.8 | 521.2 | 492.9 |

Table 7 illustrates the effect of $H_2O_2$ concentration on the use of the formulation of Ex. 8 at 50° C. As shown the $H_2O_2$ peroxide concentration did not have significant effect on silicon oxide and silicon etch rates while SiGe etch rates increased with $H_2O_2$ concentration and therefore the selectivity of SiGe over silicon and silicon oxide.

TABLE 7

| 30% $H_2O_2$ (%) | 10% | 20% | 30% | 40% | 50% (Ex. 8) |
|---|---|---|---|---|---|
| SiGe (25%) e/r | 37.2 | 148.3 | 220.1 | 285.1 | 394.3 |
| PolySi e/r | 0.5 | 0.5 | 0.7 | 0.8 | 0.8 |
| TEOS e/r | | | <1 | | |
| SiGe/Poly Si selectivity | 74.3 | 296.6 | 314.4 | 356.4 | 492.9 |

Table 8 illustrates the effect on Ge concentration in SiGe alloy on the use of the formulation of Ex. 8. The results showed that with Ge concentration increase in SiGe alloy, SiGe etch rates increased obviously, therefore the selectivity of SiGe to silicon or silicon oxide.

TABLE 8

| | SiGe10% | SiGe15% | SiGe20% | SiGe25% | SiGe30% | SiGe50% |
|---|---|---|---|---|---|---|
| Ex. 8 | 1 | 45 | 238 | 485 | 749 | 744 |

Table 9 illustrates another embodiment of an etching solution according to the disclosed and claimed subject matter.

TABLE 9

| Component | Raw Material | RM assay | CAS # | Ex. 9 |
|---|---|---|---|---|
| (i) | DIW | 100% | 7732-18-5 | 26.9 |
| (ii) | $H_2O_2$ | 30% | 7722-84-1 | 50 |
| (iii) | $NH_4F$ | 40% | 12125-01-8 | 2.5 |
| (iv) | Citric acid | 100% | 77-92-9 | 1 |
| (v) | Lupasol ® 800 | 100% | 9002-98-6 | 0.2 |
| (v) | Surfynol ® 485 | 100% | 9014-85-1 | 0.15 |
| (vi) | Methyltrimethoxysilane | 2% | 1185-55-3 | 12.5 |
| (vii) | Glycol Ether DPM | 100% | 34590-94-8 | 6.75 |

TABLE 9-continued

| Component | Raw Material | RM assay | CAS # | Ex. 9 |
|---|---|---|---|---|
| | SiGe (25%) e/r @ 35° C. | | 449.5 | |
| | PolySi e/r @ 35° C. | | 0.6 | |
| | TEOS e/r @ 35° C. | | 0.7 | |

SUMMARY

The disclosed and claimed etching solutions employ an effective silicon oxide corrosion inhibitor, therefore the SiGe etch rate can be increased at higher HF concentration, and the silicon and silicon oxide etch rates are not affected. A formulated mixture is used to demonstrate nanosheet release using a $Si_{0.75}Ge_{0.25}/Si$ multilayer stack where with a width greater than 160 nm could be released with minimal Si loss. Within a reasonable process time window, the sacrificial layers (from 5 nm to 25 nm SiGe) are completely removed, and no obvious damage to Si, silicon oxide and silicon nitride is observed. The formulations demonstrate a strong selectivity for SiGe over $SiO_2$ due to very low etch rates of $SiO_2$.

Although the disclosed and claimed subject matter has been described and illustrated with a certain degree of particularity, it is understood that the disclosure has been made only by way of example, and that numerous changes in the conditions and order of steps can be resorted to by those skilled in the art without departing from the spirit and scope of the disclosed and claimed subject matter. Thus, it will be understood by those skilled in the art that various changes may be made, and equivalents may be substituted for elements thereof without departing from the scope of the disclosed and claimed subject matter. In addition, many modifications may be made to adapt a particular situation or material to the teachings of the disclosed and claimed subject matter without departing from the essential scope thereof. In addition, all numerical values identified in the detailed description shall be interpreted as though the precise and approximate values are both expressly identified.

What is claimed is:

1. An etching solution suitable for the selective removal of silicon-germanium over silicon from a microelectronic device comprising:

(i) water;

(ii) at least one oxidizer;

(iii) at least one fluoride ion source;

(iv) at least one polyfunctional acid;

(v) at least one corrosion inhibiting surfactant;

(vi) at least one silane silicon oxide etch inhibitor comprising about 0.1 wt % to about 3 wt % of a silicon-containing compound of Formula I:

Formula I

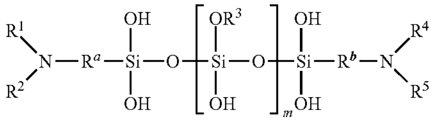

where (i) each of $R^a$ and $R^b$ is —$C_3H_6$—, (ii) each of $R^1$, $R^2$, $R^4$ and $R^5$ is —H and (iii) m=0-20; and (vii) optionally at least one water-miscible organic solvent.

2. The etching solution of claim 1, wherein the etching solution comprises about 50 wt % to about 90 wt % of water.

3. The etching solution of claim 1, wherein the oxidizer comprises about 1.5 wt % to about 20 wt % of one or more of hydrogen peroxide, periodic acid, potassium iodate, potassium permanganate, ammonium persulfate, ammonium molybdate, ferric nitrate, nitric acid, potassium nitrate, ammonia and mixtures thereof.

4. The etching solution of claim 1, wherein the etching solution comprises about 10 wt % to about 20 wt % of neat $H_2O_2$.

5. The etching solution of claim 1, wherein the fluoride ion source comprises about 0.01 wt % to about 8 wt % of one or more of hydrofluoric acid, ammonium fluoride, ammonium bifluoride, quaternary ammonium fluorides, fluoroborates, fluoroboric acid, tetrabutylammonium tetrafluoroborate, aluminum hexafluoride, and a fluoride salt of an aliphatic primary, secondary or tertiary amine having the formula:

$R^1NR^2R^3R^4F$, wherein $R^1$, $R^2$, $R^3$ and $R^4$ individually represent H or a ($C_1$-$C_4$) alkyl group.

6. The etching solution of claim 1, wherein the fluoride ion source comprises about 0.01 wt % to about 8 wt % of one or more of ammonium fluoride, ammonium bifluoride, tetramethylammonium fluoride, tetraethylammonium fluoride, methyltriethylammonium fluoride, tetrabutylammonium fluoride and combinations thereof.

7. The etching solution of claim 1, wherein the fluoride ion source comprises one or more of ammonium fluoride and ammonium bifluoride.

8. The etching solution of claim 1, wherein the etching solution comprises about 0.04 wt % to about 2.5 wt % of neat $NH_4F$.

9. The etching solution of claim 1, wherein the at least one polyfunctional acid comprises about 0.1 wt % to about 5 wt % of one or more polyfunctional organic acid selected from the group of oxalic acid, malonic acid, succinic acid, glutaric acid, adipic acid, pimelic acid, suberic acid, azelaic acid, sebacic acid, citric acid, 2-methylpropane-1,2,3-triscarboxylic acid, benzene-1,2,3-tricarboxylic acid, propane-1,2,3-tricarboxylic acid, 1,cis-2,3-propenetricarboxylic acid, butane-1,2,3,4-tetracarboxylic acid, cyclopentanetetra-1,2,3,4-carboxylic acid, benzene-1,2,4,5-tetracarboxylic acid, benzenepentacarboxylic acid and benzenehexacarboxylic acid.

10. The etching solution of claim 1, wherein the etching solution comprises about 0.1 wt % to about 5 wt % of citric acid.

11. The etching solution of claim 1, wherein the at least one polyfunctional acid comprises about 0.1 wt % to about 5 wt % one or more polyfunctional inorganic acid selected from the group of boric acid, carbonic acid, phosphorous acid, silicic acid, sulfurous acid, sulfuric acid, phosphoric acid, pyrophosphoric acid and orthosilicic acid.

12. The etching solution of claim 1, wherein the etching solution comprises about 0.1 wt % to about 5 wt % of $H_3PO_4$.

13. The etching solution of claim 1, wherein the at least one corrosion inhibiting surfactant comprises about 0.01 wt % to about 3 wt % of one or more of a polyalkyleneimine, an acetylenic diol, a modified acetylenic diol, polypropylene glycols, polyethylene or polypropylene glycol ethers or mixtures thereof.

14. The etching solution of claim 1, wherein the at least one corrosion inhibiting surfactant comprises one or more of polyethylene glycol, a polyethyleneimine and a zwitterionic surfactant.

15. The etching solution of claim 1, wherein the at least one silane silicon oxide etch inhibitor further comprises one or more of methyltrimethoxysilane, ethyltrimethoxysilane, triethoxy(ethyl)silane, vinyltrimethoxysilane, trimethoxyphenylsilane, triethoxymethylsilane, trimethoxy(octyl)silane, propyltrimethoxysilane, isobutyl(trimethoxy)silane, trimethoxysilane, n-propyltriethoxysilane, trimethoxy(octadecyl)silane, hexadecyltrimethoxysilane, methyl(tripropyl)silane, ethyl(tripropyl)silane and propyl(tripropyl)silane.

16. The etching solution of claim 1, wherein the etching solution comprises about 0.1 wt % to about 3 wt % of a silicon-containing compound having the following formula:

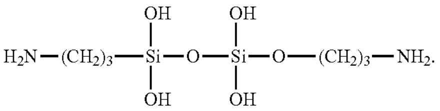

17. The etching solution of claim 1, wherein the etching solution comprises about 1 wt % to about 50 wt % of the at least one water-miscible solvent selected from the group of ethylene glycol, propylene glycol, butyl diglycol, 1,4-butanediol, tripropylene glycol methyl ether, dipropylene glycol monomethyl ether, propylene glycol propyl ether, diethylene glycol n-butyl ether, hexyloxypropylamine, poly(oxyethylene)diamine, dimethylsulfoxide, tetrahydrofurfuryl alcohol, glycerol, alcohols, sulfoxides, sulfolane and mixtures thereof.

18. The etching solution of claim 1, wherein the etching solution comprises about 5 wt % to about 50 wt % of propylene glycol.

19. The etching solution of claim 1, wherein the etching solution comprises about 5 wt % to about 50 wt % of dipropylene glycol monomethyl ether (DPM).

20. A method of selectively enhancing the etch rate of silicon-germanium relative to silicon on a microelectronic device comprising silicon and silicon-germanium, the method comprising the steps of:

(a) contacting a microelectronic (composite semiconductor) device including silicon and silicon-germanium with one or more etching solution of claim 1;

(b) rinsing the microelectronic (composite semiconductor) device after the silicon-germanium is at least partially removed; and (c) optionally drying the microelectronic, where the selectivity of the etch for silicon-germanium over silicon is greater than about 50.

* * * * *